United States Patent [19]

Loveless et al.

[11] 4,352,607
[45] Oct. 5, 1982

[54] AUTOMATIC WAFER PROCESSING SYSTEM AND METHOD

[75] Inventors: W. L. Loveless, Saratoga; Richard J. Trott, Los Gatos; Robert H. Heath, Campbell; William L. Glick, San Jose, all of Calif.

[73] Assignee: GCA Corporation, Sunnyvale, Calif.

[21] Appl. No.: 215,499

[22] Filed: Dec. 11, 1980

Related U.S. Application Data

[62] Division of Ser. No. 779,074, Mar. 18, 1977, Pat. No. 4,278,366.

[51] Int. Cl.$^3$ ............................................. B65G 51/02
[52] U.S. Cl. ................................................... 406/88
[58] Field of Search ..................... 406/88, 89, 86, 87, 406/72; 238/10 E, 10 F; 104/60, 305; 193/2 C; 46/1 K, 216, 257, 260, 261

[56] References Cited

FOREIGN PATENT DOCUMENTS 1195596 6/1970 United Kingdom ............... 406/88

OTHER PUBLICATIONS

IBM Technical Disclosure Bulletin; vol. 16, No. 9; p. 2907; Mack et al.; Feb. 1974.

*Primary Examiner*—Jeffrey V. Nase
*Attorney, Agent, or Firm*—Flehr, Hohbach, Test, Albritton & Herbert

[57] ABSTRACT

An automatic wafer processing system is modular in format and includes wafer treatment units, storage units and air bearing transport track units which are all operatively interconnected in a coplanar configuration to provide an automated wafer flow path. To facilitate such automated system improved variable width air bearing tracks are provided by flexible strips in slots.

3 Claims, 16 Drawing Figures

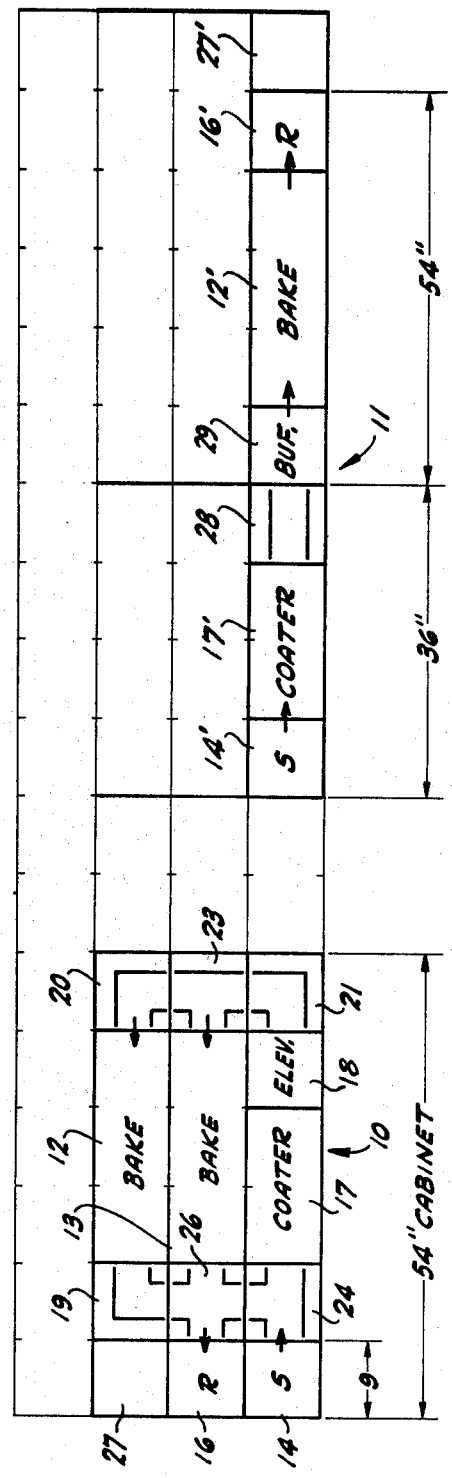

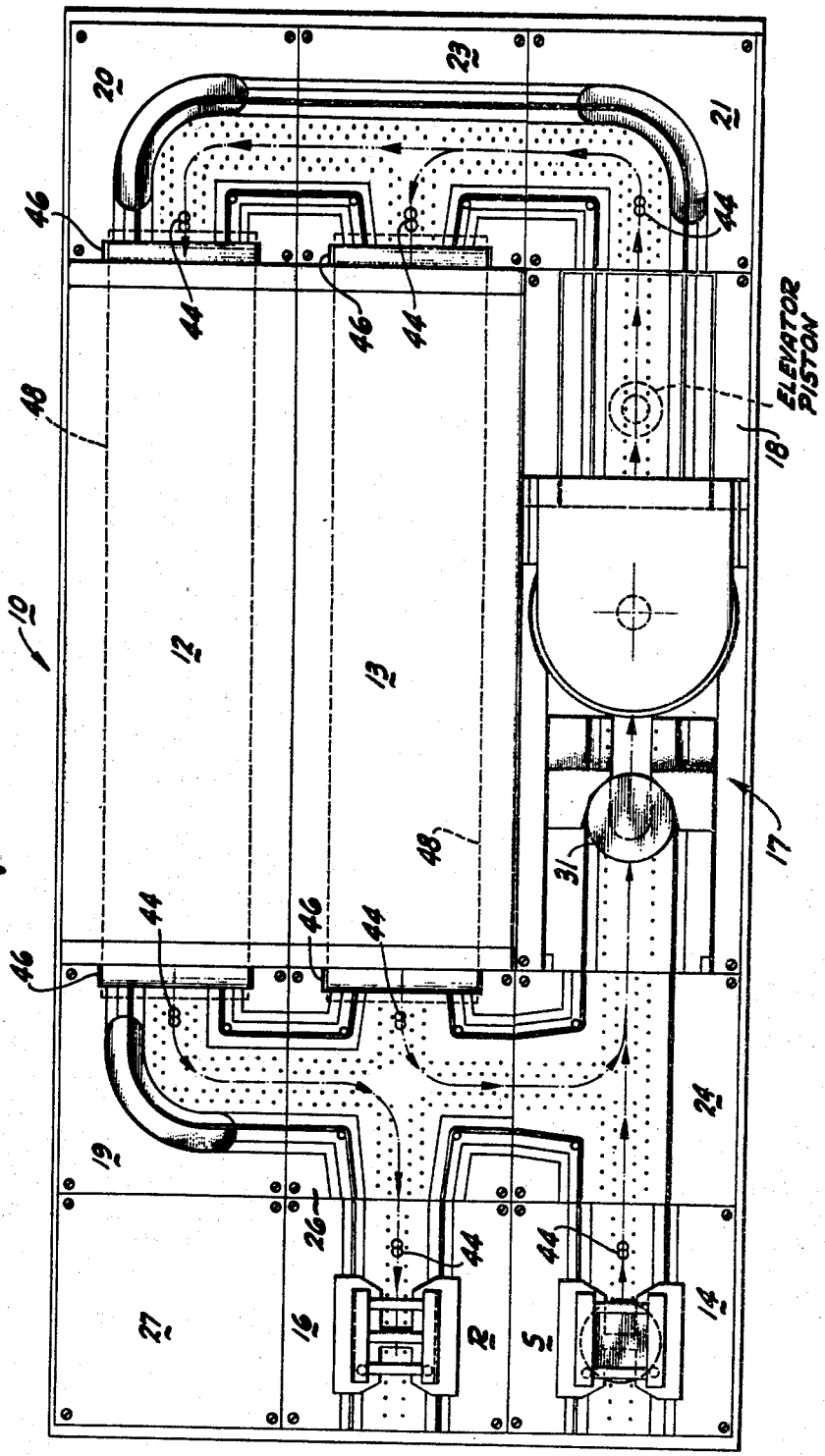

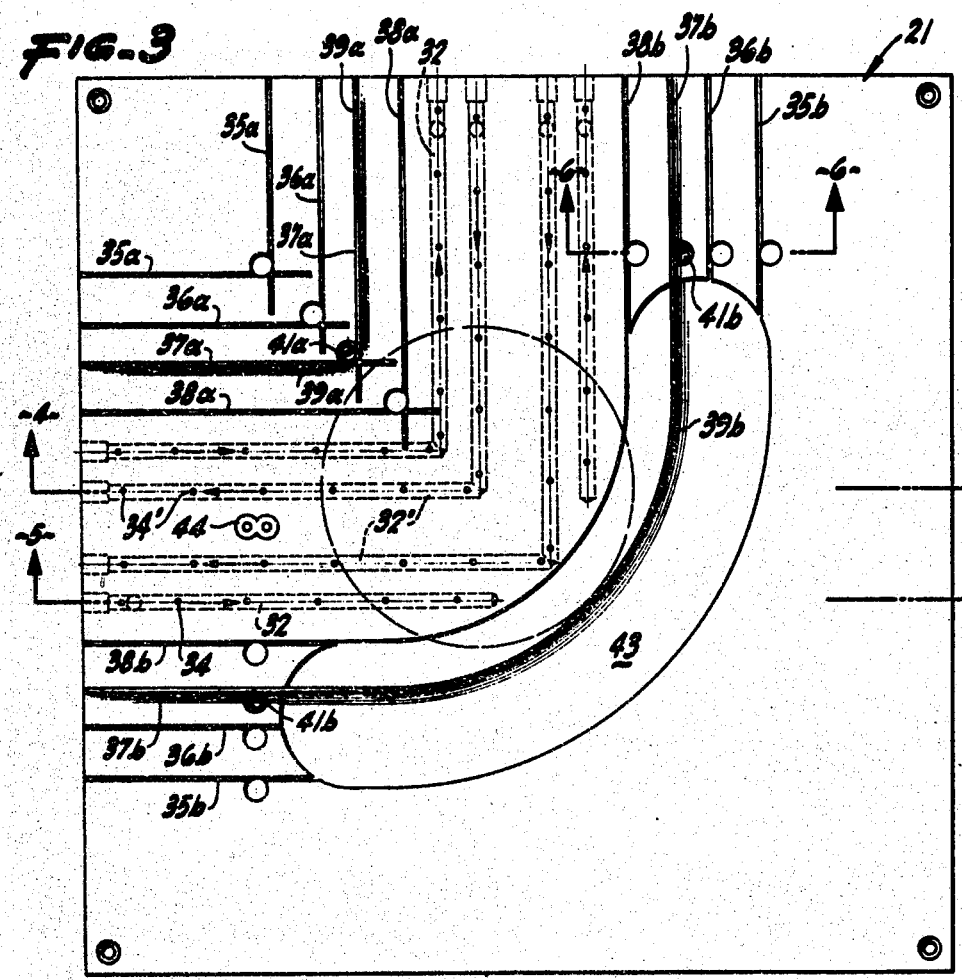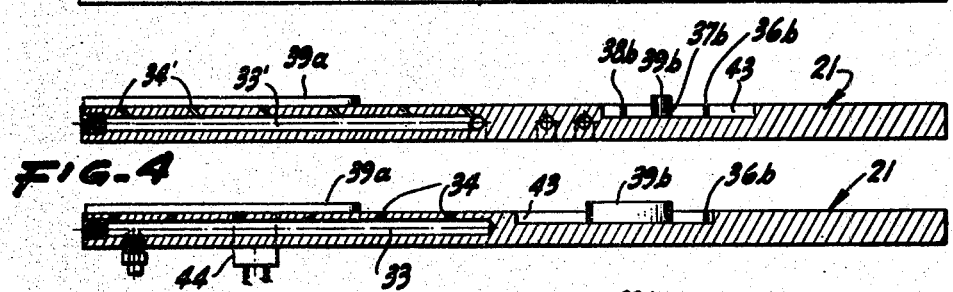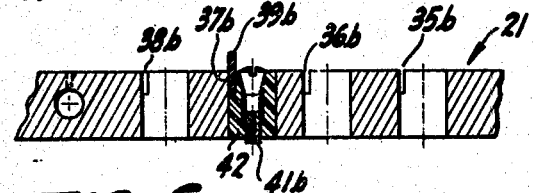

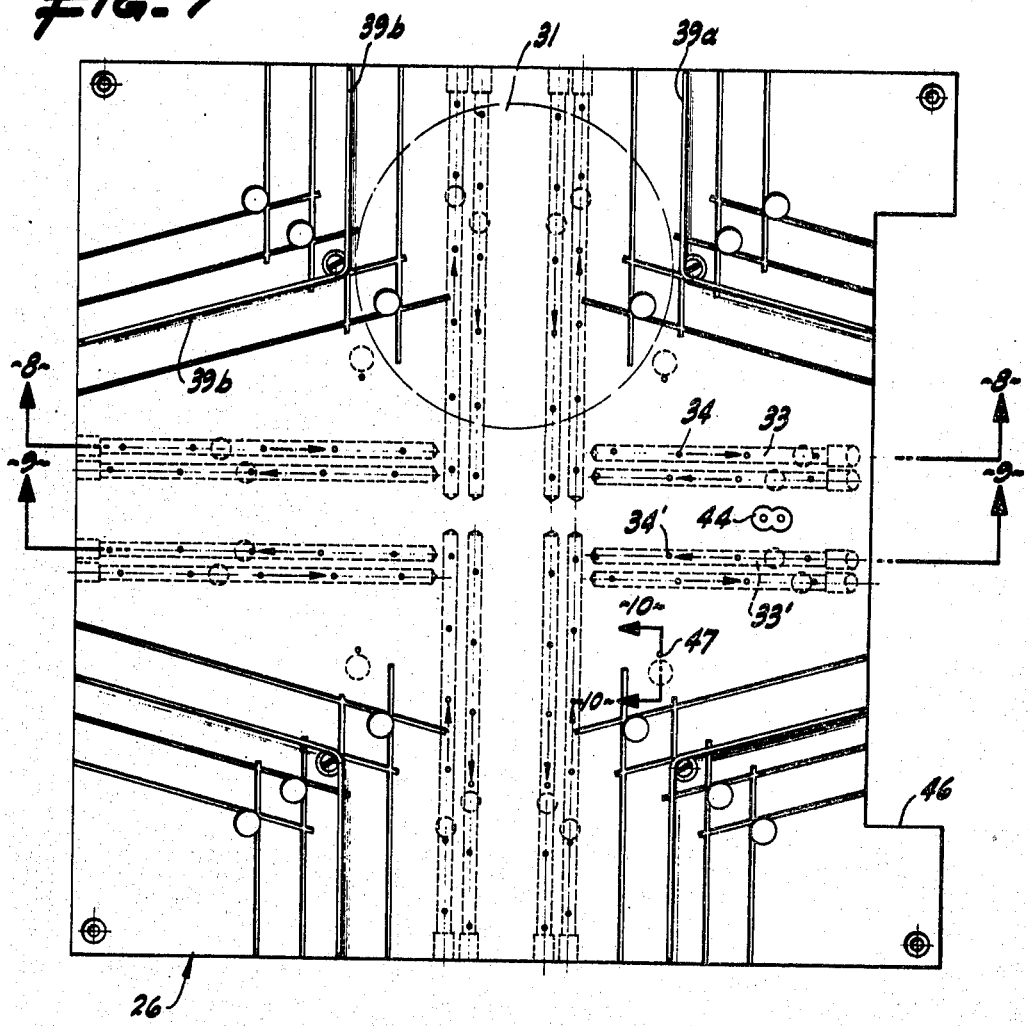
FIG. 7
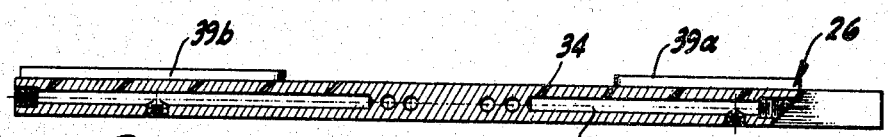
FIG. 8
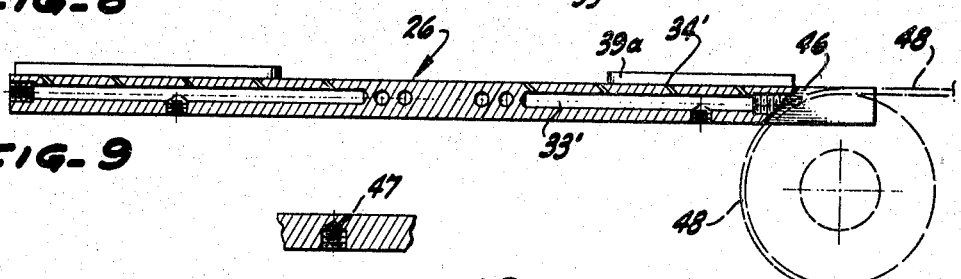
FIG. 9
FIG. 10

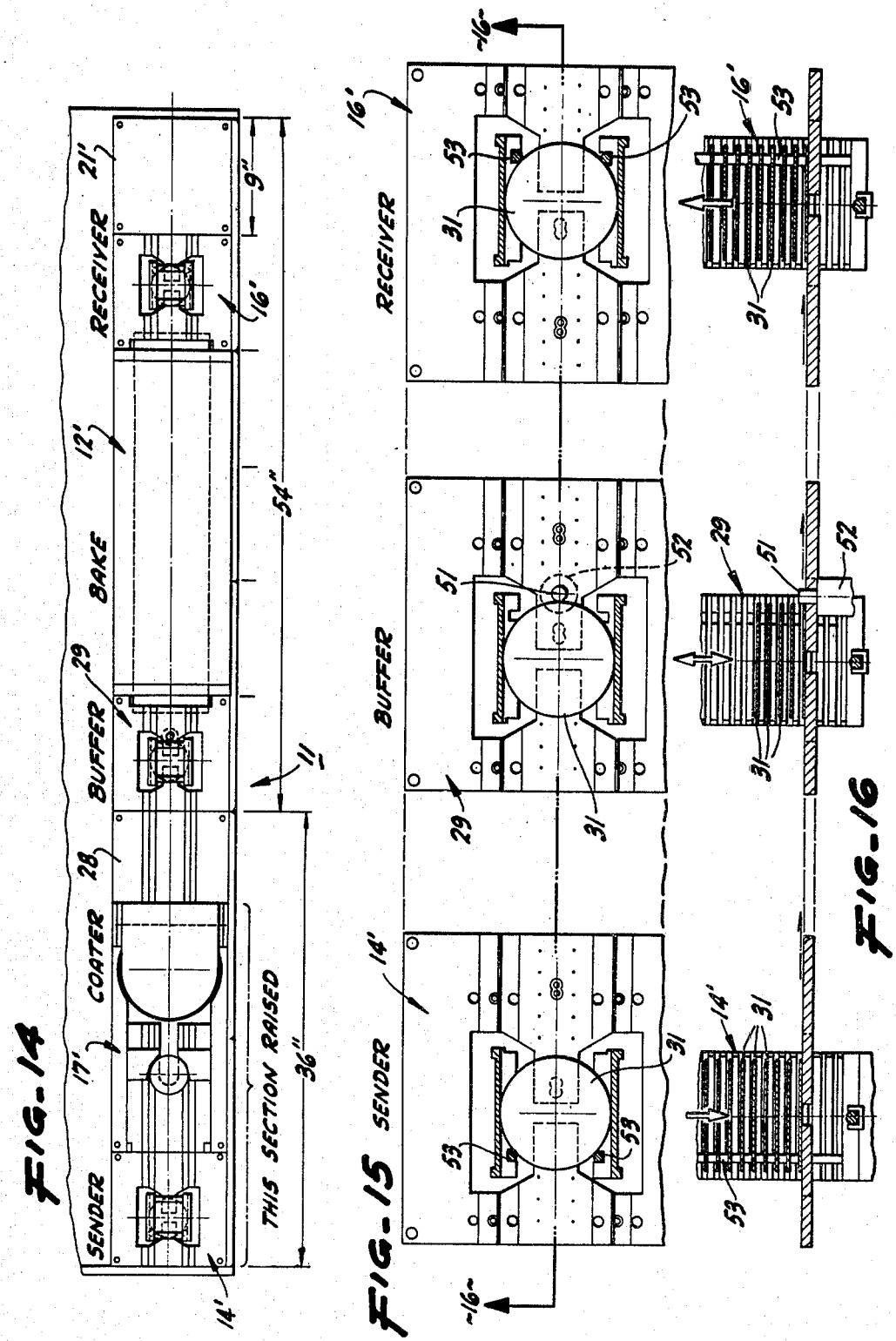

AUTOMATIC WAFER PROCESSING SYSTEM AND METHOD

This is a division of application Ser. No. 779,074, filed Mar. 18, 1977, and now U.S. Pat. No. 4,278,366, issued July 14, 1981.

BACKGROUND OF THE INVENTION

The present invention is directed to an automatic wafer processing system and method therefor and more specifically to a system for automatically handling and treating silicon wafers used in the production of integrated circuits.

Automatic wafer processing systems are well-known in the art as shown by Lasch U.S. Pat. No. 3,645,581, entitled "Apparatus and Method For Handling and Treating Articles." Here air bearings are used to transfer articles from a wafer supply storage unit to a coating unit which coats the wafer with material such as photoresist and then over another air bearing transfers the wafer to receive storage unit. A detailed explanation of at least one type of air bearing is given in another Lasch U.S. Pat. No. 3,718,371, entitled "Fluid Bearing Track Structure and Components Thereof" which illustrates both curved and straight air bearing tracks some of which are bidirectional. More sophisticated air bearing track structures or one of a different type at least is illustrated in Flint U.S. Pat. No. 3,747,753 entitled "Fluid Bearing Apparatus and Method for Handling and Gaging Articles." Sorting is accomplished by selectively diverting wafers to several wafer receive storage units. In the Flint '753 patent the cited references also show many types of track unit intersections although not of the air bearing type. A second Flint U.S. Pat. No. 3,948,564 entitled "Fluid Bearing Apparatus and Method Utilizing Selective Turn Table Diverter Structure" shows a wafer buffer unit between two other units of the system where an air bearing type turn table is operable to either store incoming wafers or provide an exit for outgoing wafers.

Also in Lasch U.S. Pat. No. 3,930,684 entitled "Automatic Wafer Feeding and Pre-Alignment Apparatus and Method" relative to the buffer unit of the '564 Flint patent there is illustrated in FIG. 4 a relatively simple type of buffer station as explained in column 16 of the patent which is capable of temporarily retaining a single wafer.

All of the foregoing patents are assigned to the present assignee.

As integrated circuit processing technology has evolved it has required the use of many additional processing techniques for the treatment of the initial silicon wafer which is the raw material of the integrated circuit. Thus special purpose automated processing systems have been developed suitable for each type of wafer processing.

OBJECTS AND SUMMARY OF THE INVENTION

It is, therefore, an object of the present invention to provide an improved automated wafer processing system and method.

It is another object of the present invention to provide a system as above which is usable with many different types of wafer processing requirements and with great flexibility.

In accordance with the above objects, there is provided a method of producing a variable width track assembly with a flat fluid bearing surface over which fragile articles are transported. A plurality of parallel slot pairs are provided in the flat surface along with a pair of flexible strips. A portion of the pair of strips is inserted in a slot pair corresponding to a predetermined track width to thereby form guides for the articles.

BRIEF DESCRIPTION OF THE DRAWINGS

FIG. 1 is a plan view in diagrammatic form of a wafer processing system embodying the present invention;

FIG. 2 is a more detailed structural view of a portion of FIG. 1;

FIG. 3 is an enlarged view of a portion of FIG. 2;

FIGS. 4, 5 and 6 are various cross-sectional views taken along lines 4—4, 5—5 and 6—6 of FIG. 3;

FIG. 7 is an enlarged view of another portion of FIG. 2;

FIGS. 8, 9 and 10 are cross-sectional views taken along lines 8—8, 9—9 and 10—10 of FIG. 7;

FIG. 14 is a more detailed structural view of another portion of FIG. 1;

FIG. 15 is an enlarged plan view of portions of FIG. 14; and

FIG. 16 is a cross-sectional view taken along line 16—16 of FIG. 15.

DETAILED DESCRIPTION OF THE PREFERRED EMBODIMENTS

Figure 11:
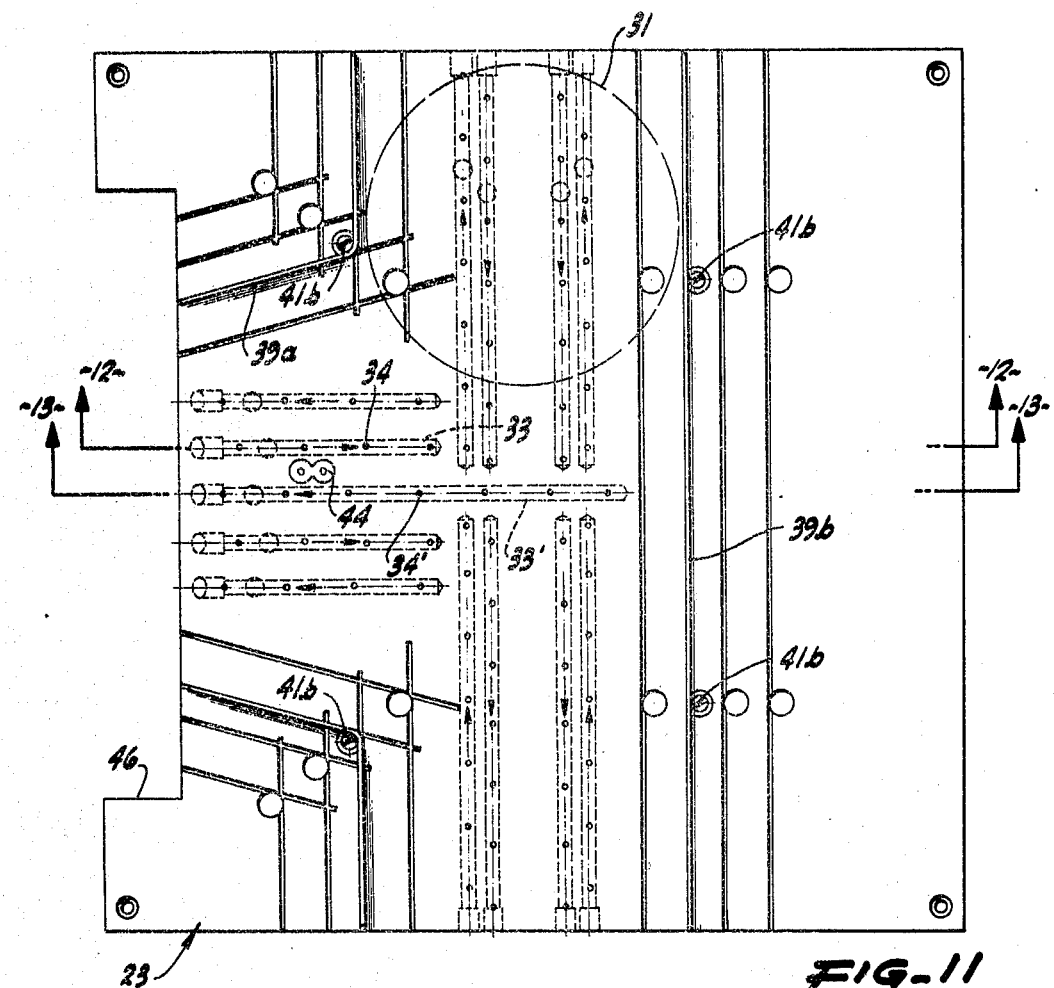
FIG. 11 is an enlarged plan view of another portion of FIG. 2.

FIG. 1 illustrates the overall system layout of two automated wafer processing systems 10 and 11. Each system is constituted by several modular units including wafer treatment units, wafer storage units and air bearing wafer track units. The units are of either a common module size, viz. 9×9 inches as illustrated by the markings in FIG. 1, or an integral multiple thereof. They are selectively retained in an operatively interconnected configuration to provide an automated flow path for treatment of silicon wafers.

Referring to the automated system 10 the wafer treatment unit includes bake units 12 and 13 which are three modules long or 27 inches. The bake units may constitute either a top infrared baking unit or a bottom baking unit. By themselves, these baking units are well-known in the art (although one having a modular size is not). Wafer storage units illustrated are a send wafer storage or indexer unit 14 for supplying wafers to the system and a receive indexer or storage unit 16 for receiving treated wafers. Both receive and send storage units constitute a single square module.

Another wafer treatment unit is coater 17 of two modules length also known as a spin processor and is shown in the '581 Lasch patent. It dispenses a liquid such as a photoresist on a spinning wafer to coat it and then the wafer is transferred to the bake oven for fixing the resist. Because of the two level configuration of the coater 17 which is disclosed and claimed in copending application in the name of Flint entitled "Apparatus and Method for Treating Wafers" Ser. No. 779,075, filed Mar. 18, 1977, and assigned to the present assignee, an elevator unit 18 is used to return the wafer being processed to the generally coplanar configuration of all of the operative units.

Interconnecting all of the foregoing are air bearing wafer transport track units. Three types are illustrated. The first are "L" type units 19, 20 and 21 for making left or right turns. The second are "T" units 23 and 24 which are self-explanatory and the third a cross unit 26. The arrows indicate the directions which the wafer may move. It is evident that the cross unit 26 may either direct a wafer to the receive storage unit 16 or into the coater 17 again. The remaining module of system 10 is a blank plate 27.

Thus the system 10 from a modular standpoint is six modules long or 54 inches and three modules wide or 36 inches. For convenience each longitudinal strip of modules is termed a track since this is the general direction of movement of the wafers on the air bearing track units. The modular units of system 10 are contained in a modular 54 inch by 36 inch cabinet. If a fourth track is desired, an add-on extension may be cantilevered on the cabinet.

System 11 illustrates only a single track system which uses a 36 inch cabinet of three modules and a 54 inch cabinet of five modules. There is a send wafer indexer unit 14', a coater 17' and a bake oven 12' which feeds to a receive indexer storage unit 16'. The blank 27' completes the system. A straight track unit 28 connects coater 17' to bake oven 12' and to an additional type of storage unit 29 which is a throughput buffer which stores the wafers in a stacked configuration in the same manner as the send and receive storage units. Because of the storage unit's 29 buffer capability, it allows the processing time of the bake oven and coater treatment units times to be different from one another.

To summarize the system of the present invention thus far the designer in laying out a system decides which modular units are necessary including the wafer treatment, wafer storage and air bearing wafer transport track units. With the aid of the modular marking of a drawing such as FIG. 1 the desired system is laid out with the necessary interconnections being provided by the various air bearing track units. Such technique as is apparent from system 10 provides great flexibility in an individual system in allowing variations in the processing of a wafer in that system. Also of equal importance as illustrated in system 11, it allows the configuration of many specialized systems with special purpose processing without the undue added expense of designing a single purpose single use processing unit. Systems 10 and 11 as shown in FIG. 1 in addition to having modularity as shown from the top view also have modularity from the equipment cabinet point of view. That is the doors of the cabinets can be conveniently made to an 18 inch module and thus a 36 inch cabinet would have two doors and a 54 inch cabinet three doors. And the supporting equipment in the cabinet such as pumps, etc. can be easily contained.

The actual physical configuration of system 10 of FIG. 1 is shown in the top view of FIG. 2. Send and receive storage units 14 and 16 are identical to those shown in the '581 Lasch patent. Coater unit 17 which is retaining a typical wafer 31, is identical to the unit disclosed in the above copending Flint application. All of the air bearing track units include a number of air holes shown as dots to provide the air bearings in a manner similar to that of the '371 Lasch patent. The possible directions of movement of wafers are shown by the arrows.

"L" type air bearing track unit 21 of FIG. 2 is shown in much greater detail in FIGS. 3, 4, 5 and 6. Here air bearing units for transporting the wafer both from the left to the top of the drawing are illustrated as units 32. And if the track unit were to be used for the opposite direction alternate air bearing units 32' are illustrated. FIG. 5 shows a typical cross section of an air bearing unit 32 which includes an integral channel 33 for supplying air and jets 34 to direct it in the proper direction. FIG. 4 shows the other direction for the units 32'.

In order to accommodate the different diameter wafers, for example, from two to five inches, each of the track units in its surface includes a plurality of parallel slot pairs each pair corresponding to a different diameter wafer. These slot pairs are illustrated as 35a,b through 38a,b. Thus, slot pair 35a,b corresponds to, for example, a five inch diameter wafer and slot pair 38a,b the smallest diameter wafer. The slots are also illustrated in FIG. 6. To provide a pair of guides for, for examples, a wafer having a size corresponding to the slot pair 37a,b, flexible strips, for example, of MYLAR (trademark) type plastic 39a,b are inserted in the corresponding slots and extend from the surface of the track unit. Because the strips are of a flexible or energy absorbing material and are fitted somewhat loosely in the slot, except for where they are retained the screws 41a,b as best shown in FIG. 6, they have a good energy absorbing capability. This minimizes silicon dust which might otherwise be produced by the silicon wafers hitting against the guides and is thus a significant improvement over the prior art type guides which were solid blocks of plastic.

Referring briefly to FIG. 6 screw 41b is rotated into a resilient insert 42 which wedges against strip 39b to retain it in the slot 37b. Actually the strips almost retain themselves by the inherent wedging action caused by their flexure and thus the added screws are only necessary for unusual situations where the unit perhaps is being removed.

Since straight slots 35 through 38 are much easier to machine where a curved track unit is needed the curved portion of strip 39b is allowed to freely curve in an elongated curved opening 43 which is a recess (see FIGS. 3 and 4) in the top surface of unit 21. This also allows the track widths to be easily changed. The corresponding strip 39a is abruptly curved around the screw 41a since wafers would not normally, because of the air bearing transport would, be abutting against strip 39a while moving around the corner.

Unit 21, along with the other air bearing track units, includes sensing means illustrated at 44 for determining whether or not a wafer is present.

A typical cross track section 26 is shown in FIG. 7 with the air bearing channels in FIGS. 8 and 9 for the various directions. One added feature of the cross track is illustrated in FIG. 10 which is an additional air jet 47 located in the four corners of the cross track unit for providing needed turning movement when necessary. One other modification of the module 26 to accommodate the associated bake oven 13 (see FIG. 2) is a notch 46 in which the bake oven belt 48 (see FIG. 9) rotates.

Figure 12:
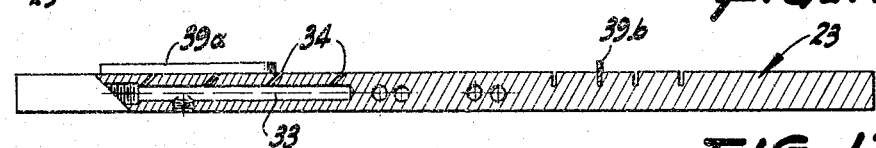
FIGS. 12 and 13 are cross-sectional views taken respectively along lines 12—12 and 13—13 of FIG. 11.
Figure 13:
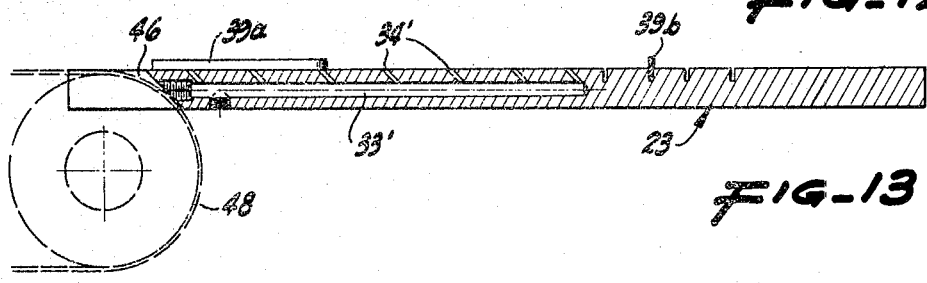

The remaining track structure illustrated in FIGS. 11 through 13 is the T section 24.

The other system 11 illustrated in FIG. 1 is shown in mechanical detail in FIG. 14. As is described in the copending Flint application the coater 17' is two level. The entire modular sections 17' and 14' (which is the send indexer or magazine or supply unit) are raised slightly to compensate for this difference.

In this system 11 coater 17' and bake unit 12' have different processing times. To compensate buffer unit 29 is included. The buffer unit is best shown in FIGS. 15 and 16 where it can be compared with the send and receive units 14' and 21'. In fact they are identical in construction retaining the wafers 31 in a spaced, stacked configuration except, that where the send and receive storage units have a common entrance and exit, buffer unit 29 operates in a throughput manner the wafers entering from one side and exiting the other. This is partially accomplished by stop 51 retracted by a piston 52 which stops and positions the wafer 31 upon entry from the left and allows the index or storage unit 29 to index upwardly and thus to receive another wafer. Upon retraction of stop 51 and actuation of the air bearings which are best shown in FIG. 15 the wafer can exit to the right. As is apparent storage unit 29' is of the LIFO type meaning the wafer which is the last in is necessarily the first out. The only other structural difference between the unit 29 and send and receive units 14' and 16' is that since the send and receive units, as discussed above, have a common entrance and exit the other end of these unit have vertical buffer bars 53 which prevent further movement of the stored wafers. There are no bars in unit 29.

In order to increase storage capacity several buffer units can be used in a series cascade.

Thus the present invention has provided an improved automatic wafer processing system and method.

What is claimed is:

1. A method of producing a variable width track assembly with a flat fluid bearing surface over which fragile articles are transported comprising the following steps: providing a plurality of parallel slot pairs in said flat surface; providing a pair of flexible strips; inserting only a portion of said pair of strips in a slot pair corresponding to a predetermined track width to thereby form guides for said articles.

2. A method as in claim 12 where said track assembly is of the "L" type for making left or right turns and where the one of said pair of strips forming the outer radius of the turn is placed in a slot except for a curved portion of the strip.

3. A method as in claim 1 including the step of clamping said slots by wedging.

* * * * *